United States Patent
See et al.

(10) Patent No.: US 6,380,066 B1
(45) Date of Patent: Apr. 30, 2002

(54) METHODS FOR ELIMINATING METAL CORROSION BY FSG

(75) Inventors: Alex See; Kok Hin Teo; Kok Hiang Tang, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/531,783

(22) Filed: Mar. 21, 2000

(51) Int. Cl.⁷ ............... H01L 21/4763; H01L 21/76
(52) U.S. Cl. ............ 438/624; 438/453; 438/618
(58) Field of Search ............... 438/453, 618, 438/624

(56) References Cited

U.S. PATENT DOCUMENTS

| | | | |
|---|---|---|---|
| 5,482,900 A | * 1/1996 | Yang | 438/623 |
| 5,759,906 A | 6/1998 | Lou | 438/623 |
| 5,858,869 A | 1/1999 | Chen et al. | 438/597 |
| 5,908,672 A | 6/1999 | Ryu et al. | 427/574 |
| 5,937,323 A | 8/1999 | Orczyk et al. | 438/624 |
| 6,228,777 B1 | * 5/2001 | Arafa et al. | 438/740 |

* cited by examiner

*Primary Examiner*—Trung Dang
*Assistant Examiner*—William M. Brewster
(74) *Attorney, Agent, or Firm*—George O. Saile; Rosemary L. S. Pike; Stephen G. Stanton

(57) ABSTRACT

A method of fabricating metal plugs within via openings comprising the following steps. A semiconductor substrate having an overlying metal layer and oxide hard masks overlying the metal layer is provided. The oxide hard masks are used to etch the metal layer to form metal lines separated by metal line openings. An oxide liner is formed over the etched structure. A layer of FSG is deposited over the oxide liner. The FSG layer is then planarized to remove: the excess of the FSG layer from the etched structure; and the portions of the oxide liner over the oxide hard masks to form FSG blocks within the metal line openings. A cap layer is formed over the planarized structure. The cap layer and hard masks are then planarized to form via openings exposing the metal lines. Planarized metal plugs are then within the via openings.

18 Claims, 5 Drawing Sheets

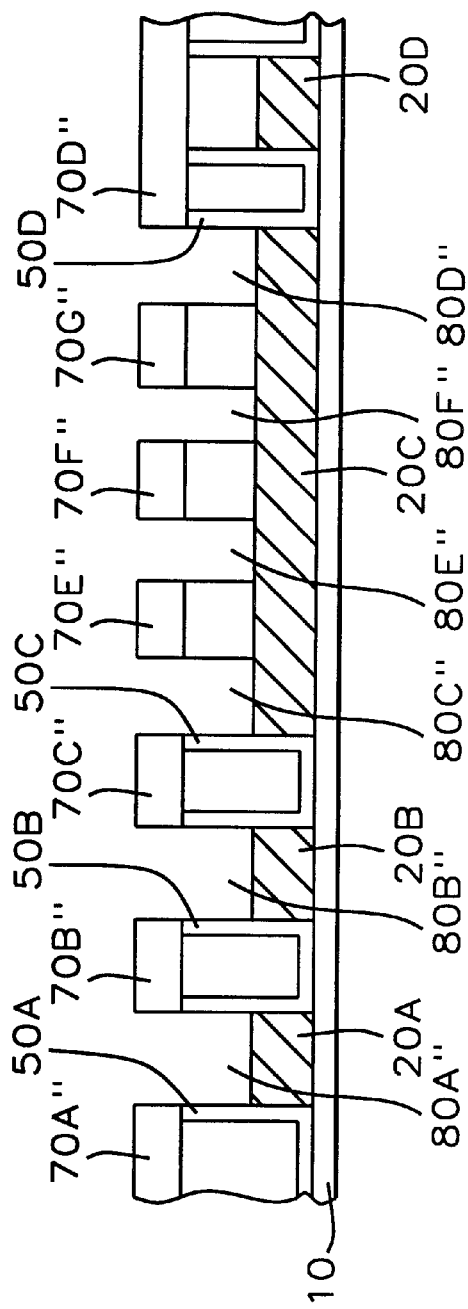
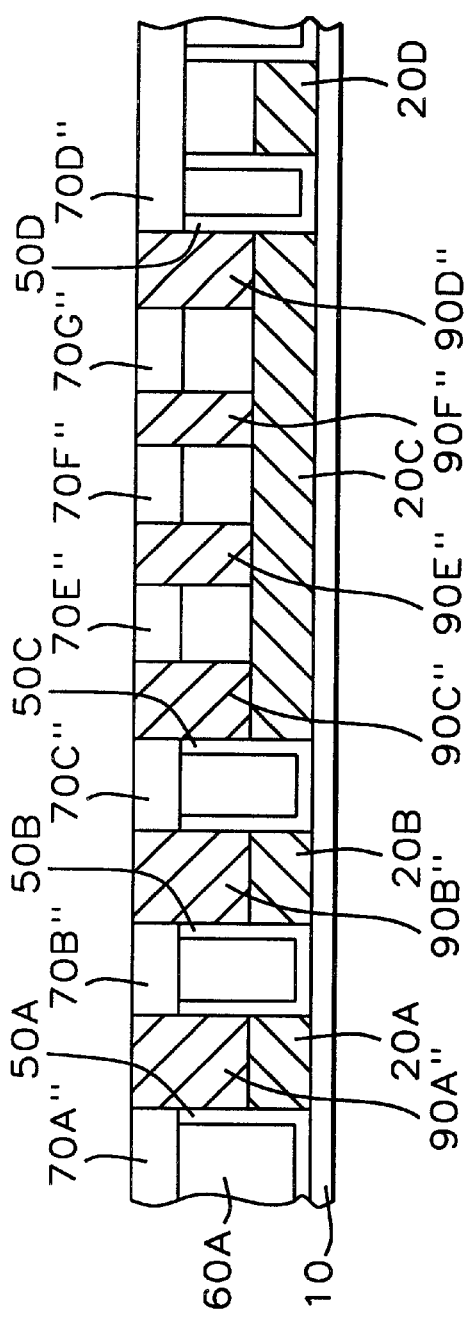
FIG. 9
FIG. 10

METHODS FOR ELIMINATING METAL CORROSION BY FSG

FIELD OF THE INVENTION

The present invention relates generally to methods of forming metal plugs within vias used in the formation of semiconductor devices and specifically to a method of eliminating metal corrosion by FSG (fluorinated silica glass).

BACKGROUND OF THE INVENTION

Semiconductor devices constantly decrease in size with more and more devices, of a smaller and smaller design rule, per fabricated wafer. Interconnect layers, usually formed of FSG, are formed over the devices. Via openings are formed within the interconnect layers and are filled with metal plugs to form electrical connections with the underlying layers.

U.S. Pat. No. 5,937,323 to Orczyk et al. describes a method of forming a fluorinated silicon glass (FSG) layer on a substrate. An undoped silicon glass (USG) liner under the FSG layer protects the substrate from corrosive attack.

U.S. Pat. No. 5,908,672 to Ryu et al. describes a planarized passivation layer that includes an FSG layer and a silicon nitride layer. The FSG layer is preferably deposited using triethoxyfluorosilane (TEFS) and tetraethoxyorthosilicate (TEOS).

U.S. Pat. No. 5,858,869 to Chen et al. describes a method for making multilevel electrical interconnections having a planar intermetal dielectric (IMD) with low dielectric constant k and good thermal conductivity. Metal lines are formed and an anisotropic plasma oxide (APO) is deposited thereover, lining the sidewalls and upper surface of the metal lines. A low k polymer is deposited over the APO and the polymer and the APO are CMP'ed back to the top of the metal lines. An FSG layer is deposited and via holes are etched in the FSG layer. The APO provides wider openings between metal lines filled with the low k polymer.

U.S. Pat. No. 5,759,906 to Lou describes a method of forming a planar intermetal dielectric layer (IMD) for multilevel electrical interconnections on ULSI circuits. After via holes are etched in the IMD, an FSG insulating layer is deposited and etched back to form sidewall spacers in the via holes to prevent outgassing from the SOG or low—k polymer.

SUMMARY OF THE INVENTION

Accordingly, it is an object of the present invention to provide a method of forming metal plugs within via openings that eliminates metal corrosion by FSG film.

Other objects will appear hereinafter.

It has now been discovered that the above and other objects of the present invention may be accomplished in the following manner. Specifically, a semiconductor substrate having an overlying metal layer and oxide hard masks overlying the metal layer is provided. The oxide hard masks are used to etch the metal layer to form metal lines separated by metal line openings. An oxide liner is formed over the etched structure. A layer of FSG is deposited over the oxide liner. The FSG layer is then planarized to remove: the excess of the FSG layer from the etched structure; and the portions of the oxide liner over the oxide hard masks to form FSG blocks within the metal line openings. A cap layer is formed over the planarized structure. The cap layer and hard masks are then planarized to form via openings exposing the metal lines. Planarized metal plugs are then within the via openings.

BRIEF DESCRIPTION OF THE DRAWINGS

The features and advantages of the method of forming metal plugs within via openings which eliminates metal corrosion by the use of an FSG film according to the present invention will be more clearly understood from the following description taken in conjunction with the accompanying drawings in which like reference numerals designate similar or corresponding elements, regions and portions and in which:

FIGS. 9 and 10 schematically illustrate in cross-sectional representation an alternate, borderless via embodiment of the present invention.

DETAILED DESCRIPTION OF THE PREFERRED EMBODIMENT

Process Known to the Inventors

The current low—K (low dielectric constant) process for forming an interconnect layer includes an about 500 Å liner layer, formed of either SiN or $SiO_2$, on patterned metal. This is followed by about 16,000 Å of a HDP-FSG (high density plasma fluorinated film). Next, the FSG film is chemically-mechanically polished (CMP) to about 6,000 Å and capped with about 4,000 Å of a PECVD (plasma enhanced chemical vapor deposition) oxide layer.

Via openings are then formed within the FSG film exposing portions of the patterned metal. The side and bottom surfaces of the via openings are coated with a barrier metal sandwich layer comprised of a TiN layer over a Ti layer. Tungsten, or aluminum, metal plugs are then formed within the barrier metal coated via openings.

However, the problem with this current process is that the thin barrier metal layer within the via openings permits outgassing of fluorine from the FSG film which attacks the tungsten or aluminum creating a void during filling of the via openings to form the metal plugs.

Preferred Embodiment of the Present Invention

Unless otherwise specified, all structures, layers, etc. may be formed or accomplished by conventional methods known in the prior art.

A key feature of the present invention is the double oxide layers (e.g. 50A, 30A') which further assist in preventing outgassing of fluorine from the FSG blocks 60A–D into metal plugs 90A–D. More specifically, the novel oxide portions 30A'–D' (the second of the double oxide layers), not previously shown in the prior art, provide additional shielding of the metal plugs 90A–D.

Figure 1:
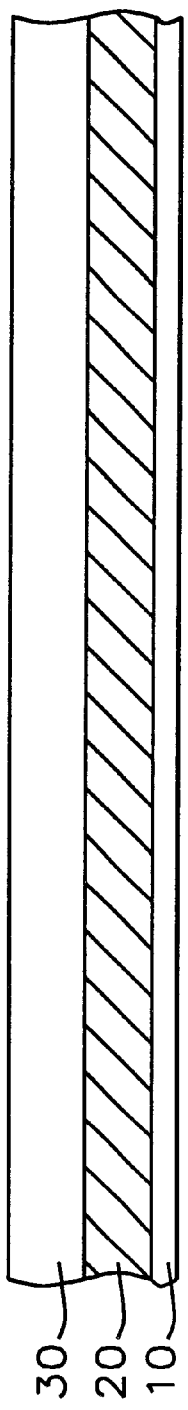
FIGS. 1 through 8 schematically illustrate in cross-sectional representation a preferred embodiment of the present invention.

Accordingly as shown in FIG. 1, starting semiconductor structure 10 has overlying upper M1 (for example) metal layer 20 formed thereover. Metal layer 20 may be comprised of Al, AlCu, or AlSiCu, and is preferably comprised of AlCu, and has a thickness of from about 3000 to 8000 Å.

Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. Preferably, the top surface of semiconductor structure 10 is comprised of a dielectric layer.

Oxide layer (SiO₂) 30 is then formed over metal layer 20 to a thickness of from about 2000 to 4000 Å.

Figure 2:
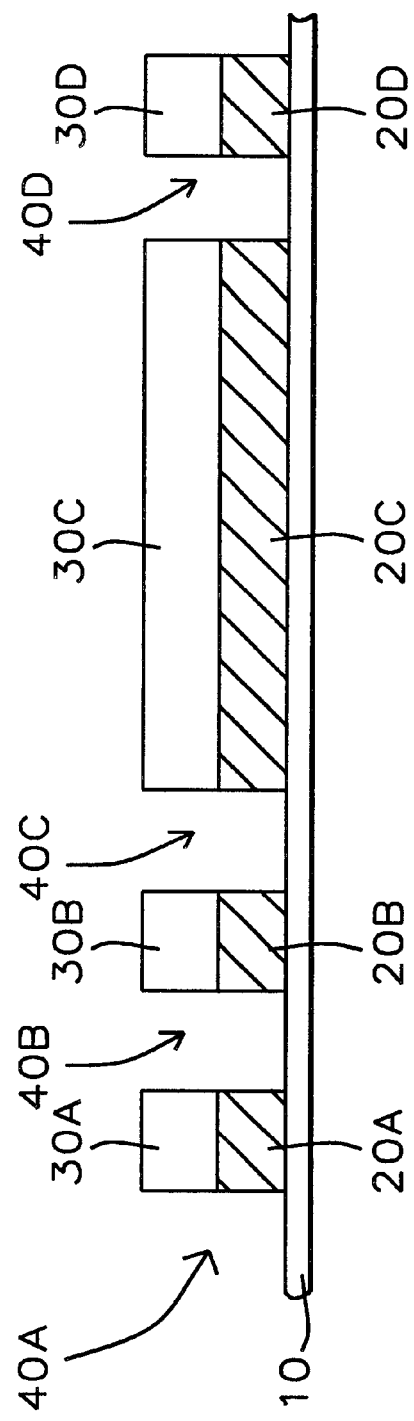

As shown in FIG. 2, oxide layer 30 is patterned to form oxide hard masks 30A, 30B, 30C, 30D, for example, over metal layer 20.

Using oxide hard masks 30A, 30B, 30C, 30D, metal layer 20 is etched to form M1 metal lines 20A, 20B, 20C, 20D, respectively, with metal line openings 40A, 40B, 40C, 40D there between. Metal line openings 40A, 40B, 40C, 40D may have widths from about 2000 to 6000 Å.

Although metal lines 20A, 20B, 20C, 20D are illustrated for purposes of example, metal layer 20 may be etched to achieve any number of desired metal lines or patterns.

Figure 3:
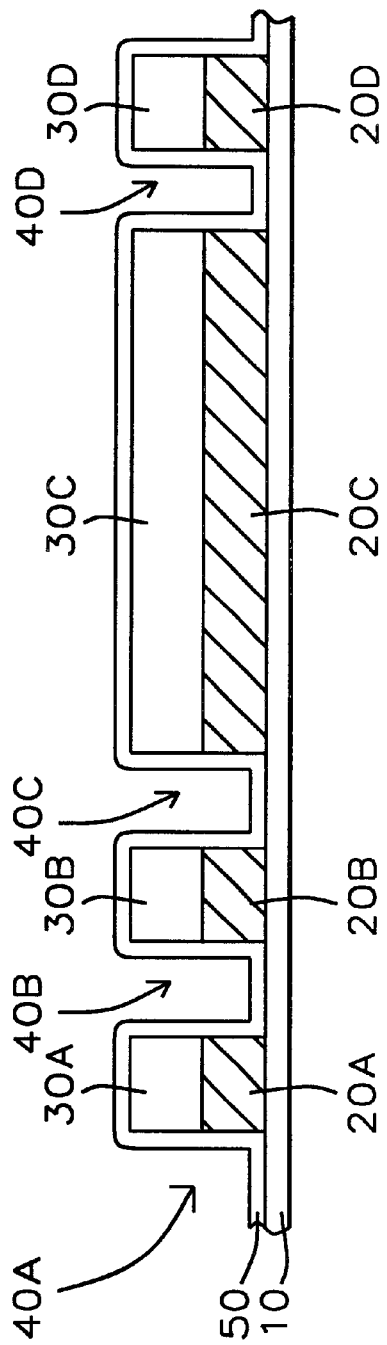

As shown in FIG. 3, oxide liner 50 is formed over oxide hard masks 30A, 30B, 30C, 30D, the exposed portions of metal lines 20A, 20B, 20C, 20D and the exposed portions of semiconductor structure 10. Oxide liner 50 is preferably is comprised of SiO₂ and has a thickness of from about 100 to 1000 Å.

Figure 4:
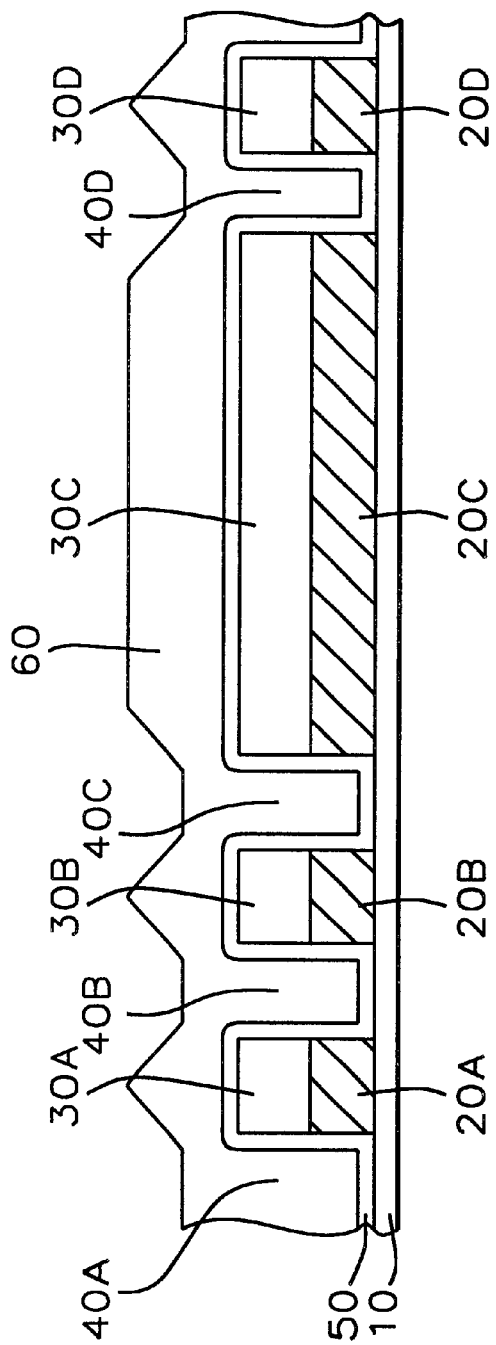

As shown in FIG. 4, a film of fluorinated silica glass (FSG) 60 is deposited over the structure, filling metal line openings 40A, 40B, 40C, 40D, and blanket filling patterned oxide layer 30, i.e. oxide hard masks 30A, 30B, 30C, 30D. FSG layer 60 is preferably deposited by a high density plasma (HDP) method to form HDP-FSG layer 60 having a thickness of from about 5000 to 10,000 Å.

Figure 5:
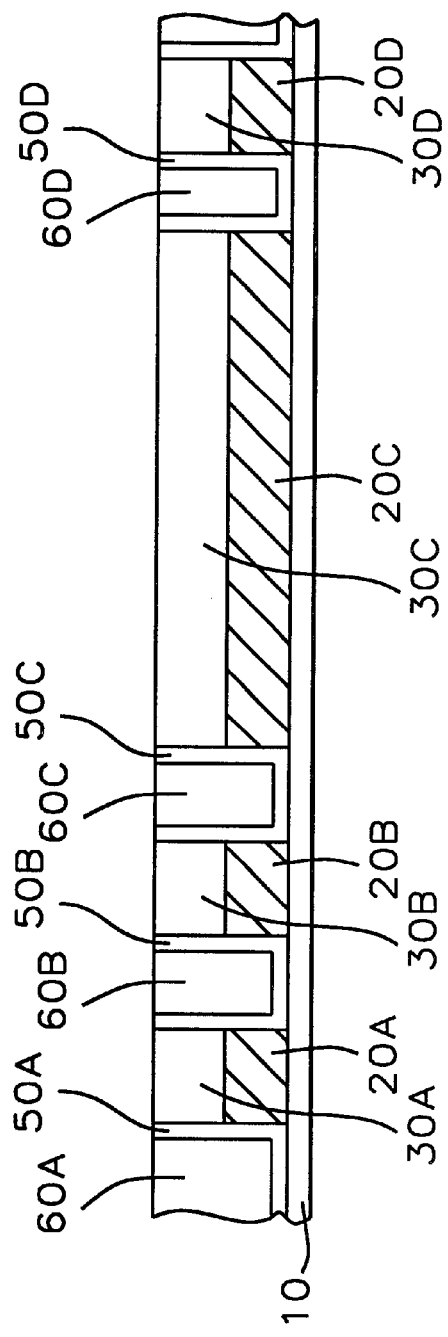

As shown in FIG. 5, HDP-FSG layer 60 is then planarized to the level of patterned oxide layer 30, preferably by chemical-mechanically polishing (CMP), which also removes the portion of oxide liner 50 overlying oxide hard masks 30A, 30B, 30C, 30D. This forms HDP-FSG blocks (or plugs) 60A, 60B, 60C, 60D within openings 40A, 40B, 40C, 40D, respectively, lined by remaining portions 50A, 50B, 50C, 50D, respectively, of oxide liner 50. Oxide lined plugs 60A, 60B, 60C, 60D serve to isolate metal lines 20A, 20B, 20C, 20D.

Figure 6:
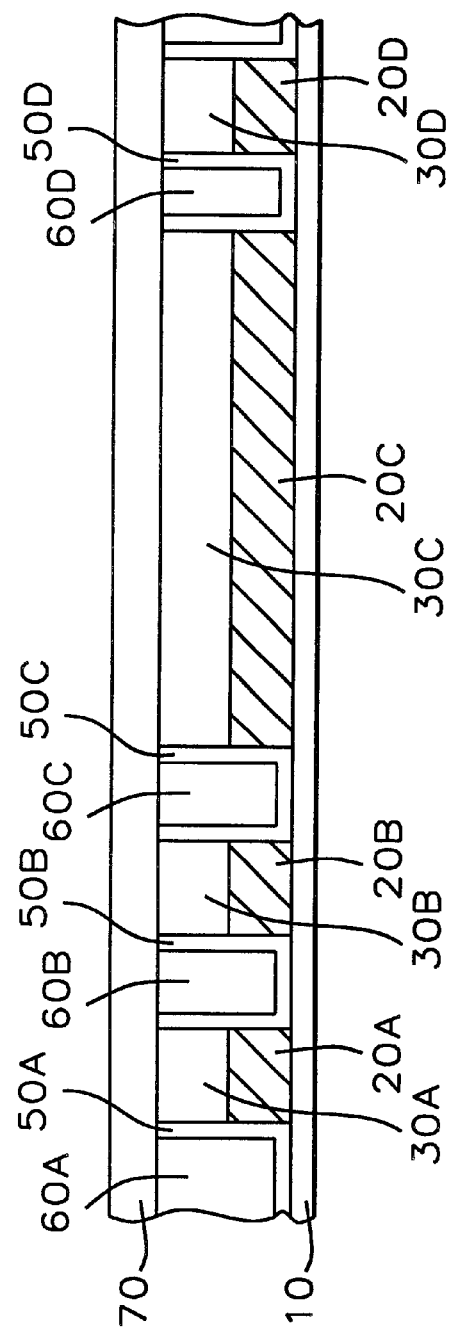

As shown in FIG. 6, cap oxide layer 70 is formed over the planarized structure to a thickness of from about 2000 to 4000 Å. Cap layer 70 is preferably comprised of silicon-rich silicon oxide (Si-rich oxide).

Figure 7:
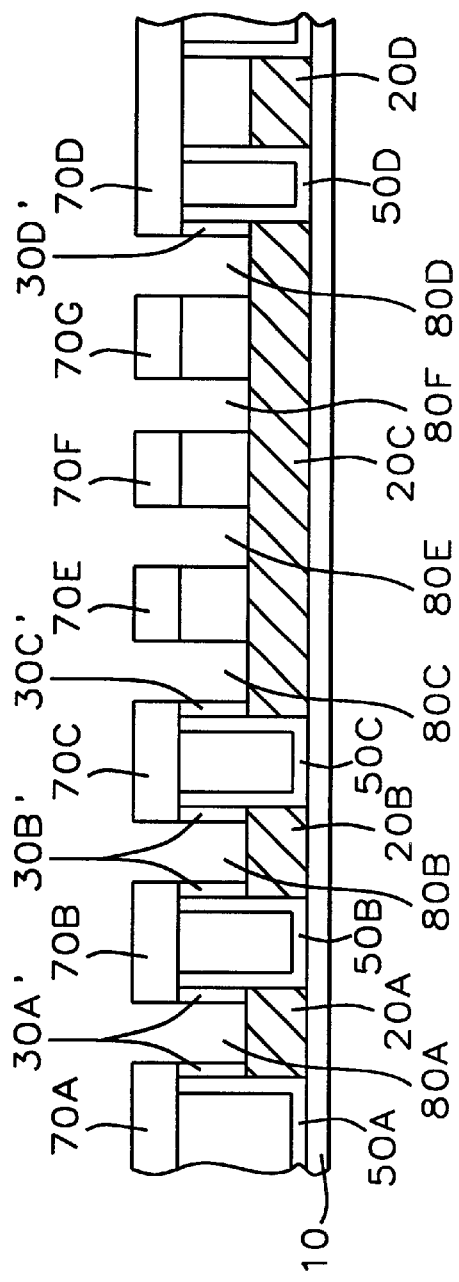

As shown in FIG. 7, Si-rich cap oxide layer 70 is patterned to form cap oxide masks 70A, 70B, 70C, 70D and 70E, 70F, 70G exposing a portion of underlying oxide hard masks 30A, 30B, 30C, 30D.

In a key step of the first embodiment, the exposed portions of underlying oxide hard masks 30A, 30B, 30C, 30D are etched, preferably by a dry etch, to form via openings 80A, 80B, 80C, 80D; and 80E, 80F exposing portions of metal lines 20A, 20B; and 20C, respectively.

That is, during the cap layer 70 and hard masks 30A, 30B, 30C, 30D patterning step, only a central portion of said hard masks 30A, 30B, 30C, 30D are etched, leaving a portion of said hard masks 30A', 30B', 30C', 30D' lining at least one side wall of the via openings 80A, 80B, 80C, 80D adjacent the respective oxide liners 50A, 50B, 50C, 50D in said via openings.

A portion 30A', 30B', 30C' of oxide hard masks 30A, 30B, 30C, respectively, remain adjacent oxide liner 50 within via openings 80A, 80B, 80C, 80D, respectively. Oxide hard mask portions 30A', 30B', 30C', 30D' are from about 500 to 1000 Å thick. Oxide layers 50A/30A'; 50B/30B'; 50C/30C', and 50D/30D', respectively, prevent outgassing of fluorine from FSG blocks 60A–D into metal plugs 90A–D. Oxide hard mask portions 30A', 30B', 30C', 30D' provide an additional measure of protection in assisting oxide liner portions 50A, 50B, 50C, 50D in preventing outgassing of fluorine from FSG blocks 60A–D into metal plugs 90A–D.

A barrier metal layer (not shown) may be formed within via openings 80A, 80B, 80C, 80D, 80E, 80F, lining the bottom and side walls of via openings 80A, 80B, 80C, 80D, 80E, 80F. The barrier liner may be comprised of a single layer of TiN or Ti, or a dual layer comprised of a layer of TiN over a layer of Ti.

Figure 8:
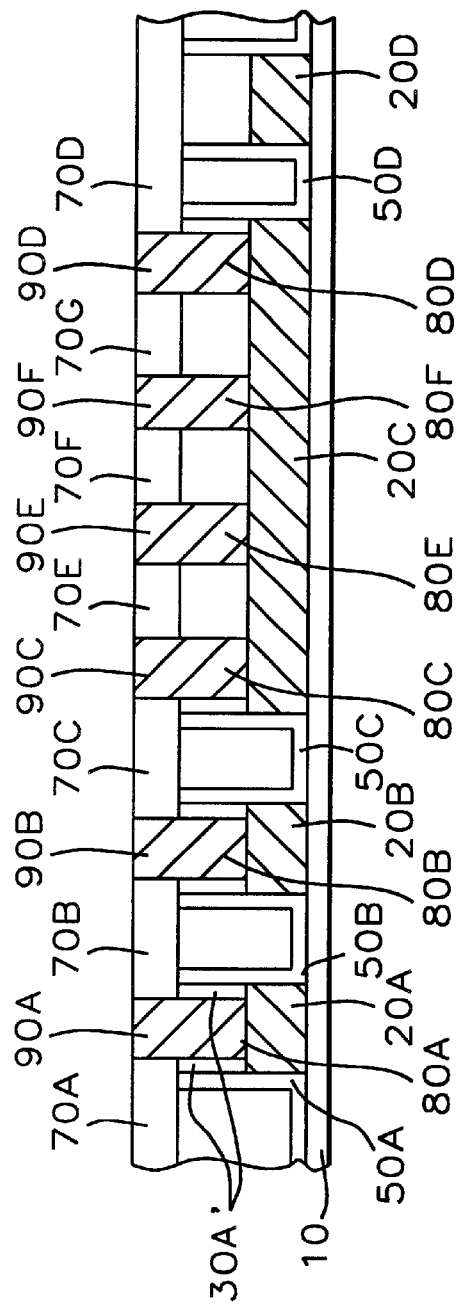

As shown in FIG. 8, a layer of metal (not shown), is then deposited over the structure, filling via openings 80A, 80B, 80C, 80D, 80E, 80F and blanket filling patterned Si-rich cap oxide layer 70. The metal layer is then planarized, preferably by CMP, to remove the excess metal from the surface of patterned Si-rich cap oxide layer 70 and forming planarized metal plugs 90A, 90B, 90C, 90D, 90E, 90F within via openings 80A, 80B, 80C, 80D, 80E, 80F, respectively.

Metal plugs 90A, 90B, 90C, 90D, 90E, 90F may be comprised of W, Al, or Cu, and are preferably comprised of tungsten (W).

Oxide hard mask portions 30A', 30B', 30C' assist in preventing outgassing of fluorine from HDP-FSG blocks 60A, 60B, 60C, 60D into metal plugs 90A, 90B, 90C, 90D, corroding metal plugs 90A, 90B, 90C, 90D. Cap oxide masks 70A, 70B, 70C, 70D over FSG blocks 60A, 60B, 60C, 60D, respectively, prevent outgassing of fluorine from FSG into any overlying layers.

Double oxide layers (e.g. 50A, 30A') provide an extra level of protection in preventing outgassing of fluorine from the FSG blocks 60A–D into metal plugs 90A–D. More specifically, the novel oxide portions 30A'D' (the second of the double oxide layers), not previously shown in the prior art, provide additional shielding of the metal plugs 90A–D in the first embodiment.

Alternate Embodiment of the Present Invention—Borderless Via Process

An alternate embodiment of the present invention is shown in FIGS. 9 and 10. The previous steps shown in FIGS. 1–6 are the same, and all element numbers are the same.

The alternate embodiment of FIGS. 9 and 10 permits the formation of borderless plugs within via openings via openings 80A, 80B, 80C, 80D, 80E, 80F. The only difference in the formation of borderless plugs of FIGS. 9 and 10 versus the plugs of FIGS. 7 and 8, is that there is not any oxide hard mask portions 30A', 30B', 30C' within via openings 80A, 80B, 80C, 80D, respectively.

As shown in FIG. 9, Si-rich cap oxide layer 70 is patterned to form cap oxide masks 70A", 70B", 70C", 70D" and 70E", 70F", 70G" exposing a portion of underlying oxide hard masks 30A, 30B, 30C, 30D.

The exposed portions of underlying oxide hard masks 30A, 30B, 30C, 30D are etched, preferably by a dry etch, to form via openings 80A", 80B"; and 80C", 80D", 80E", 80F" exposing metal lines 20A, 20B; and 20C, respectively.

A barrier metal layer (not shown) may be formed within via openings 80A", 80B", 80C", 80D", 80E", 80F", lining the bottom and side walls of via openings 80A", 80B", 80C", 80D", 80E", 80F". The barrier liner may be comprised of a single layer of TiN or Ti, or a dual layer comprised of a layer of TiN over a layer of Ti.

As shown in FIG. 10, a layer of metal (not shown), is then deposited over the structure, filling via openings 80A", 80B", 80C", 80D", 80E", 80F" and blanket filling Si-rich cap oxide masks 70A", 70B", 70C", 70D" and 70E", 70F", 70G". The metal layer is then planarized, preferably by CMP, to remove the excess metal from the surface of Si-rich cap oxide masks 70A", 70B", 70C", 70D" and 70E", 70F", 70G"

and forming planarized metal plugs 90A'', 90B'', 90C'', 90D'', 90E'', 90F'' within via openings 80A'', 80B'', 80C'', 80D'', 80E'', 80F'', respectively.

Metal plugs 90A'', 90B'', 90C'', 90D'', 90E'', 90F'' may be comprised of W, Al, or Cu, and are preferably comprised of tungsten (W). Oxide layers 50A, 50B, 50C, 50D limit outgassing of fluorine from the FSG blocks 60A, B, C, D, respectively, into metal plugs 90A'', 90B'', 90C'', D'', respectively, in the second embodiment.

While particular embodiments of the present invention have been illustrated and described, it is not intended to limit the invention, except as defined by the following claims.

We claim:

1. A method of fabricating metal plugs within via openings, comprising the steps of:
    providing a semiconductor substrate having an overlying metal layer and oxide hard masks overlying said metal layer;
    using said oxide hard masks to etch said metal layer forming metal lines separated by metal line openings;
    forming an oxide liner over said etched structure;
    depositing a layer of FSG over said oxide liner;
    planarizing said FSG layer to remove the excess of said FSG layer from said etched structure and to remove the portions of said oxide liner over said oxide hard masks, forming FSG blocks within said metal line openings;
    depositing a cap layer over said planarized structure;
    patterning said cap layer and hard masks to form via openings through said cap layer and said hard mask layer, exposing said metal lines; and
    forming planarized metal plugs within said via openings wherein in said cap layer and hard masks patterning step, a central portion of said hard masks are etched, leaving a portion of said hard masks lining at least one side wall of said via openings adjacent the respective oxide liners in said via openings.

2. The method of claim 1, wherein said FSG layer is formed by a high density plasma process.

3. The method of claim 1, wherein said via openings have a width from about 3000 to 5000 Å.

4. The method of claim 1, wherein said oxide hard masks have a thickness from about 2000 to 4000 Å; said oxide liner has a thickness from about 100 to 1000 Å; said FSG layer has a thickness from about 5000 to 10,000 Å; said cap layer has a thickness from about 2000 to 4000 Å.

5. The method of claim 1, wherein said oxide hard masks have a thickness from about 2500 to 3500 Å; said oxide liner has a thickness from about 300 to 700 Å; said FSG layer has a thickness from about 6000 to 8000 Å; said cap layer has a thickness from about 2500 to 3500 Å.

6. The method of claim 1, wherein said metal layer is comprised of a material selected from the group aluminum, AlCu, and AlSiCu; FSG layer is comprised of HDP-FSG; said oxide liner is comprised of $SiO_2$; and said cap layer is comprised of silicon-rich silicon oxide.

7. The method of claim 1, wherein said via openings formed within said FSG blocks have a portion of said hard masks lining at least one side wall said via openings; said hard mask liners having a thickness of from about 500 to 1000 Å.

8. The method of claim 1, wherein said via openings formed within said FSG blocks have a portion of said hard masks lining at least one side wall said via openings 80; said oxide hard mask portions having a thickness of from about 600 to 700 Å.

9. The method of claim 1, wherein said metal plugs are comprised of tungsten.

10. The method of claim 1, further including the step of forming a metal barrier layer within said via openings; said metal barrier layer being comprised of a layer of TiN over a layer of Ti.

11. A method of fabricating metal plugs within via openings, comprising the steps of:
    providing a semiconductor substrate having an overlying metal layer and oxide hard masks overlying said metal layer;
    using said oxide hard masks to etch said metal layer forming metal lines separated by metal line openings;
    forming an oxide liner over said etched structure;
    depositing a layer of HDP-FSG over said oxide liner;
    planarizing said HDP-FSG layer to remove the excess of said HDP-FSG layer from said etched structure and to remove the portions of said oxide liner over said oxide hard masks, forming HDP-FSG blocks within said metal line openings;
    depositing a cap layer over said planarized structure;
    patterning said cap layer and hard masks to form via openings through said cap layer and said hard masks, exposing said metal lines; said via openings having a width from about 3000 to 5000 Å; and
    forming planarized metal plugs within said via openings; wherein in said cap layer and hard masks patterning step, a central portion of said hard masks are etched, forming via openings formed within said HDP-FSG blocks that have a portion of said hard masks lining at least one side wall said via openings adjacent the respective oxide liners in said via openings.

12. The method of claim 11, wherein said oxide hard masks have a thickness from about 2000 to 4000 Å; said oxide liner has a thickness from about 100 to 1000 Å; said HDP-FSC layer has a thickness from about 5000 to 10,000 Å; said cap layer has a thickness from about 2000 to 4000 Å.

13. The method of claim 11, wherein said oxide hard masks have a thickness from about 2500 to 3500 Å; said oxide liner has a thickness from about 300 to 700 Å; said HDP-FSG layer has a thickness from about 6000 to 8000 Å; said cap layer has a thickness from about 2500 to 3500 Å.

14. The method of claim 11, wherein said metal layer is comprised of a material selected from the group aluminum, AlCu, and AlSiCu; said oxide liner is comprised of undoped silicate glass (USG); and said cap layer is comprised of silicon-rich silicon oxide.

15. The method of claim 11, wherein said via openings formed within said HSP-FSG blocks have a portion of said hard masks lining at least one side wall said via openings; said hard mask liners 30 having a thickness of from about 500 to 1000 Å.

16. The method of claim 11, wherein said via openings formed within said HDP-FSG blocks have a portion of said hard masks lining at least one side wall said via openings; said oxide hard mask portions having a thickness of from about 600 to 799 Å.

17. The method of claim 11, wherein said metal plugs are comprised of tungsten.

18. The method of claim 11, further including the step of forming a metal barrier layer within said via openings; said metal barrier layer being comprised of a layer of TiN over a layer of Ti.

* * * * *